(12) United States Patent
DeLong et al.

(10) Patent No.: US 11,070,199 B2
(45) Date of Patent: Jul. 20, 2021

(54) DETECTING PEAK LASER PULSES USING CONTROL SIGNAL TIMINGS

(71) Applicant: Alcon Inc., Fribourg (CH)

(72) Inventors: Scott DeLong, Pagosa Springs, CO (US); David Jung, Tustin, CA (US)

(73) Assignee: ALCON INC.

( * ) Notice: Subject to any disclaimer, the term of this patent is extended or adjusted under 35 U.S.C. 154(b) by 168 days.

(21) Appl. No.: 16/292,660

(22) Filed: Mar. 5, 2019

(65) Prior Publication Data
US 2019/0280681 A1    Sep. 12, 2019

Related U.S. Application Data

(60) Provisional application No. 62/640,215, filed on Mar. 8, 2018.

(51) Int. Cl.
*H03K 5/1532*    (2006.01)
*H01S 5/026*    (2006.01)

(52) U.S. Cl.
CPC .......... *H03K 5/1532* (2013.01); *H01S 5/026* (2013.01)

(58) Field of Classification Search
CPC ........ H03K 5/1532; H03K 5/01; H01S 5/026; G01J 2001/1668; G01J 2001/4238; G01J 2001/4242
See application file for complete search history.

(56) References Cited

U.S. PATENT DOCUMENTS

| | | | | |
|---|---|---|---|---|
| 5,291,505 A | * | 3/1994 | Nielsen | H01S 3/1312 |
| | | | | 372/38.03 |
| 5,347,120 A | * | 9/1994 | Decker | G01S 7/4804 |
| | | | | 250/214 B |
| 5,663,731 A | * | 9/1997 | Theodoras, II | G01S 7/2921 |
| | | | | 342/70 |
| 7,103,077 B2 | * | 9/2006 | Schuhmacher | G01J 1/4257 |
| | | | | 372/25 |
| 2002/0154668 A1 | | 10/2002 | Knowles et al. | |
| 2007/0024841 A1 | * | 2/2007 | Kloza | G01S 17/10 |
| | | | | 356/5.03 |
| 2007/0086713 A1 | | 4/2007 | Ingmar et al. | |

FOREIGN PATENT DOCUMENTS

WO    WO2016209656 A1    12/2016

* cited by examiner

*Primary Examiner* — Jennifer D Bennett

(57) ABSTRACT

In certain embodiments, a system for detecting a peak laser pulse includes a laser, a photodiode configured to detect pulses emitted by the laser, and circuitry for detecting a peak pulse timing of the laser. The circuitry is configured to receive a periodic series of voltage signals based on laser pulses detected by the photodiode, stretch the voltage signals, and obtain sampled voltages from the stretched voltage signals using periodic control signals. The circuitry is further configured to shift the timing of the periodic control signals, compare the sampled voltages for respective timings of the control signals, and select an optimal control signal timing based on the comparison.

17 Claims, 18 Drawing Sheets

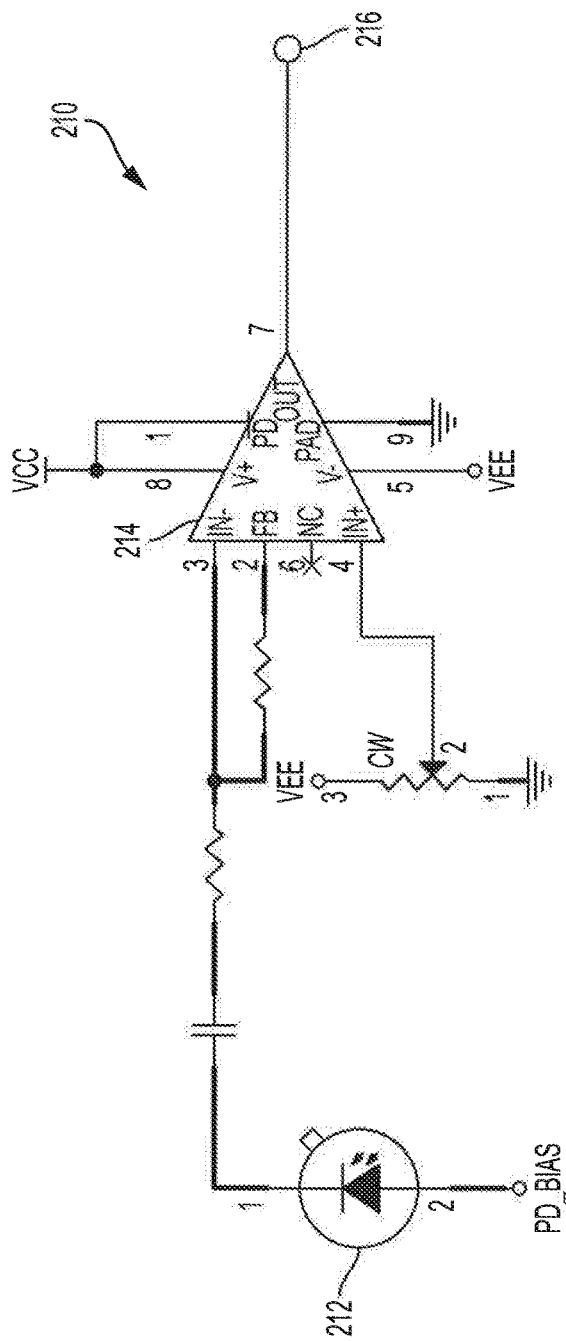
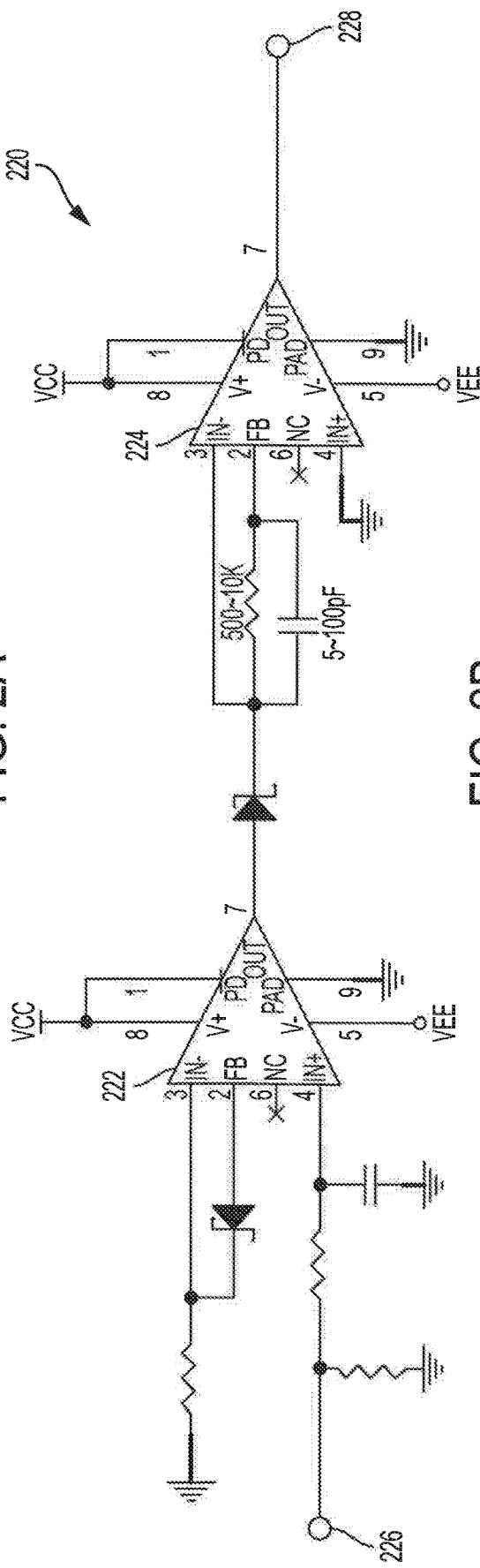
FIG. 2A
FIG. 2B

DETECTING PEAK LASER PULSES USING CONTROL SIGNAL TIMINGS

FIELD

The present disclosure relates to laser systems, and more particularly to a system for detecting peak laser pulses using shifted control signal timings.

BACKGROUND

Laser systems may generate a series of pulses used for various purposes. Many laser systems utilize femtosecond lasers that have very short pulse widths. Because of these short pulse widths, measuring and digitizing femtosecond laser pulses using current systems may use high-end, expensive analog-to-digital converters (ADCs). Such systems may, however, still miss detecting pulses or not accurately capture a peak pulse energy level.

SUMMARY

In certain embodiments, a system for detecting a peak laser pulse includes a laser, a photodiode configured to detect pulses (e.g., femtosecond or picosecond pulses) emitted by the laser, and circuitry for detecting a peak pulse timing of the laser. The circuitry is configured to receive a periodic series of voltage signals based on laser pulses detected by the photodiode, stretch the voltage signals, and obtain sampled voltages from the stretched voltage signals using periodic control signals. The circuitry is further configured to shift the timing of the periodic control signals, compare the sampled voltages for respective timings of the control signals, and select an optimal control signal timing based on the comparison.

In certain embodiments, an apparatus includes circuitry configured to receive a periodic series of voltage signals based on laser pulses (e.g., femtosecond or picosecond pulses) detected by a photodiode, stretch the voltage signals, and obtain sampled voltages from the stretched voltage signals using periodic control signals. The circuitry is further configured to shift the timing of the periodic control signals, compare the sampled voltages for respective timings of the control signals, and select an optimal control signal timing based on the comparison.

In certain embodiments, a method for detecting a peak pulse emitted by a laser includes receiving a periodic series of voltage signals based on laser pulses (e.g., femtosecond or picosecond pulses) detected by a photodiode, stretching the voltage signals, and obtaining a set of sampled voltages from the stretched voltage signals using a set of shifted control signals. Each shifted control signal may have a respective timing offset from the other control signals. The method also includes determining an optimal control signal timing based on a comparison of the sampled voltages for each of the timing offsets.

Certain embodiments may provide one or more technical advantages, in some instances. For example, in some aspects, all emitted laser pulses may be detected and accurately measured for peak pulse energy levels. In addition, in some aspects, femtosecond laser pulse sequences may be detected at or above a 50 kHz repetition rate, including but not limited to repetition rates in the range of 50-500 kHz. Some aspects may achieve these advantages at a lower cost than current systems These and other advantages will be apparent to those skilled in the art in view of the present drawings and specification.

BRIEF DESCRIPTION OF THE DRAWINGS

For a more complete understanding of the present disclosure and the advantages thereof, reference is now made to the following description taken in conjunction with the accompanying drawings in which like reference numerals indicate like features and wherein:

FIG. 2A is a diagram of an example photodetector circuit for converting an optical signal to a voltage signal.

FIG. 2B is a diagram of an example integrating circuit for stretching a voltage signal.

Figure 1A:
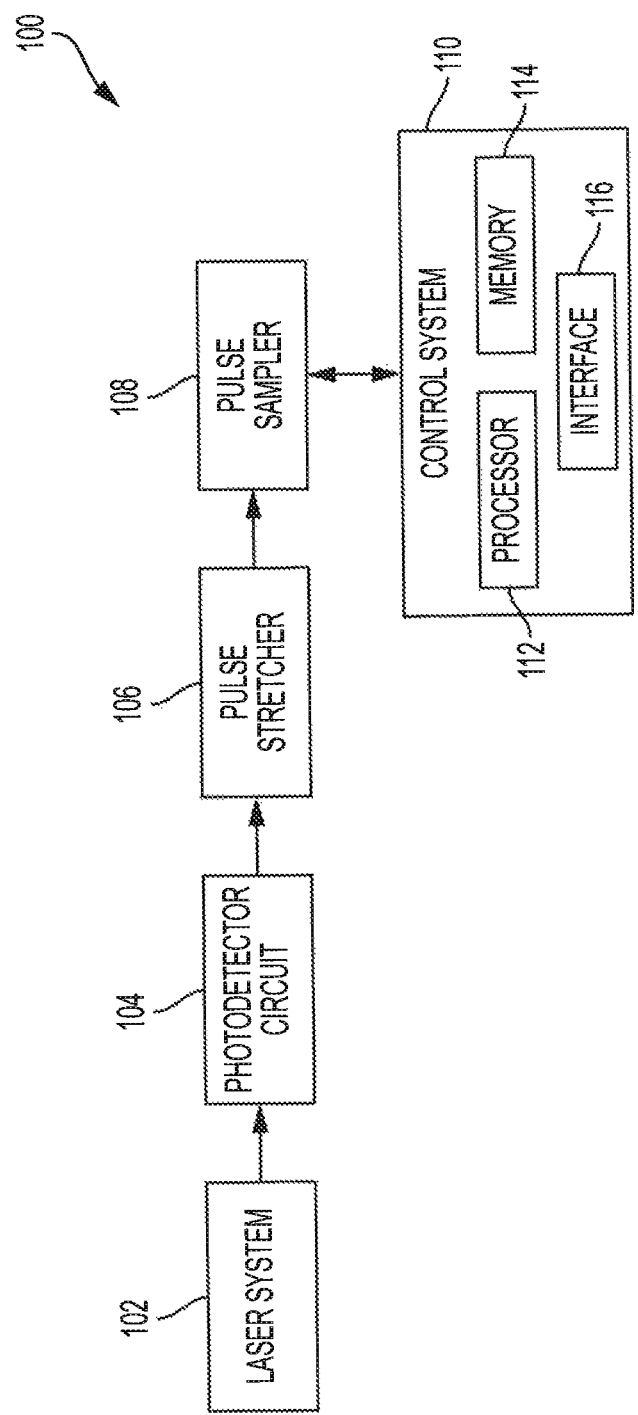
FIG. 1A is a diagram of an example system for detecting peak pulse timing of a laser system.

One skilled in the art will understand that the drawings, described below, are for illustration purposes only, and are not intended to limit the scope of applicant's disclosure.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of the disclosure is intended. Alterations and further modifications to the described systems, devices, and methods, and any further application of the principles of the present disclosure are contemplated as would normally occur to one skilled in the art to which the disclosure relates. In particular, it is contemplated that the systems, devices, and/or methods described with respect to one embodiment may be combined with the features, components, and/or steps described with respect to other embodiments of the present disclosure. For the sake of brevity, however, the numerous iterations of these combinations will not be described separately. For simplicity, in some instances the same reference numbers are used throughout the drawings to refer to the same or like parts.

FIG. 1A is a diagram of an example peak pulse detection system 100. In some embodiments, the peak pulse detection system 100 may determine an optimal control signal timing for detecting peak pulses of a femtosecond or picosecond laser system. The peak pulse detection system 100 includes a laser system 102, a photodetector circuit 104, a pulse stretcher 106, a pulse sampler 108, and a control system 110.

The laser system 102 generates a series of laser pulses, which are directed toward the photodetector circuit 104. In some cases, the laser system 102 includes a femtosecond or picosecond laser, such as a Ytterbium-based (e.g., a Yb:Glass or Yb-doped fiber) laser, an Erbium-based (e.g., an Er-doped fiber) laser, a Titanium Sapphire (TiAl2O3) laser, Chromium-based (e.g., Cr:LiSAF Cr:LiCAF, or Cr:LiS-GAF) laser, an Alexandrite laser, a neodymium-doped yttrium aluminum garnet (Nd:YAG) laser, a semiconductor- or dye-based laser, or another type of laser. In certain examples, the laser pulses may be in the range of 300 femtoseconds to 1.2 picoseconds, 500-1000 femtoseconds, 700-900 femtoseconds, or approximately 800 femtoseconds. The laser system 102 may be a component of a larger system not shown in FIG. 1A. For example, in some embodiments, the laser system 102 is a component of an ophthalmic laser surgical system for refractive, anterior, or posterior segment surgery, an Optical Coherence Tomography (OCT) system, or other types of ophthalmic diagnostic or surgical systems or medical device. In certain examples, laser system 102 may comprise an ophthalmic laser surgical system such as LenSx® Laser System or WaveLight® FS200 laser system manufactured by Alcon.

The photodetector circuit 104 receives pulses from the laser system 102 and converts the optical information in the pulses into electrical information. In some embodiments, the photodetector circuit 104 may include a photodiode that converts optical pulse signals received from the laser system 102 into voltage pulse signals. Additionally, in some embodiments, the photodetector circuit 104 may include an operational amplifier (opamp) circuit in addition to the photodiode. In some embodiments, for example, the photodetector circuit 104 may be configured similar to the photodetector circuit 210 of FIG. 2A, and may be configured to produce a voltage signal output similar to the waveform 302 of FIG. 3 or waveform 402 of FIG. 4A.

The pulse stretcher 106 receives the voltage signals generated by the photodetector circuit 104 and stretches the voltage signals. In some embodiments, the pulse stretcher 106 may include an integrating circuit that stretches the voltage signals received from the photodetector circuit. The integrating circuit may include two or more cascaded opamps. In some embodiments, for example, the pulse stretcher 106 may be configured similar to the integrating circuit 220 of FIG. 2B, and may be configured to produce a stretched voltage signal output similar to the waveform 404 of FIG. 4B or waveform 502 of FIG. 5.

The pulse sampler 108 receives the stretched voltage signals from the pulse stretcher 106 and provides a sampled voltage based on the stretched voltage signals received. The pulse sampler 108 may include logic that samples the stretched voltage signals based on control signals received from the control system 110. In some embodiments, the pulse sampler 108 holds the sampled voltage for a duration of time. In some embodiments, for example the pulse sampler 108 may be configured similar to the pulse expansion circuit 230 of FIG. 2C, and may be configured to provide a voltage signal output similar to the waveform 602 of FIG. 6.

The control system 110 provides control signals to the pulse sampler 108 for sampling the stretched voltage signals. The control signals may be generated in a periodic manner based on a repetition rate of the laser system 102. In some embodiments, the control signals may be pulse signals that are aligned with an estimated pulse sequence for the laser system 102. For example, the control system 110 may generate square wave pulses at a repetition rate that is substantially similar to a nominal repetition rate for the laser system 102 (e.g., within 1-10% of the repetition rate). In some embodiments, for example, the control signals may be formatted similar to the waveform 504 of FIG. 5.

In addition, the control system 110 receives sampled voltage signals from the pulse sampler 108 and analyzes the received signals to determine an optimal control signal timing. For example, the control system 110 may shift the timing of the control signals provided to the pulse sampler 108, compare the sampled voltage values for the different shifts in control signal timing, and select a control signal timing based on the comparison. In some embodiments, the control system 110 may shift the timing of the control signals by a time step, and compare the sampled voltage values to determine which time step provides a peak sampled voltage value (which may coincide with sampling the stretched voltage signal closer to the peak pulse point). For example, the control system 110 may shift the control signal timing in 5 ns steps as shown in FIGS. 7A-7E, and compare the resulting sampled voltages to determine an optimal control signal timing shift. The time steps may be another suitable value, such as 2 ns, 7 ns, or another time step amount.

The control system 110 includes a processor 112, memory 114, and an interface 116. The example processor 112 executes instructions, for example, to generate output data based on data inputs. The instructions can include programs, codes, scripts, or other types of data stored in memory. Additionally, or alternatively, the instructions can be encoded as pre-programmed or re-programmable logic circuits, logic gates, or other types of hardware or firmware components. The processor 112 may be or include a general-purpose microprocessor, as a specialized co-processor or another type of data processing apparatus. In some cases, the processor 112 may be configured to execute or interpret software, scripts, programs, functions, executables, or other instructions stored in the memory 114 to determine an optical control signal timing for detecting peak pulses of a laser system. In some instances, the processor 112 includes multiple processors.

The example memory 114 includes one or more computer-readable media. For example, the memory 114 may include a volatile memory device, a non-volatile memory device, or a combination thereof. The memory 114 can include one or more read-only memory devices, random-access memory devices, buffer memory devices, or a combination of these and other types of memory devices. The memory 114 may store instructions that are executable by the processor 112.

The example interface 116 provides communication between the control system 110 and one or more other devices. For example, the interface 116 may include one or more hardware interfaces that allow interaction with the control system 110 by a user, such as through a keyboard, mouse, touchscreen, and the like. As another example, the interface 116 may include a network interface (e.g., a wireless interface or a wired interface) that allows communication between the control system 110 and pulse sampler 108. The interface 116 may include another type of interface.

Figure 1B:
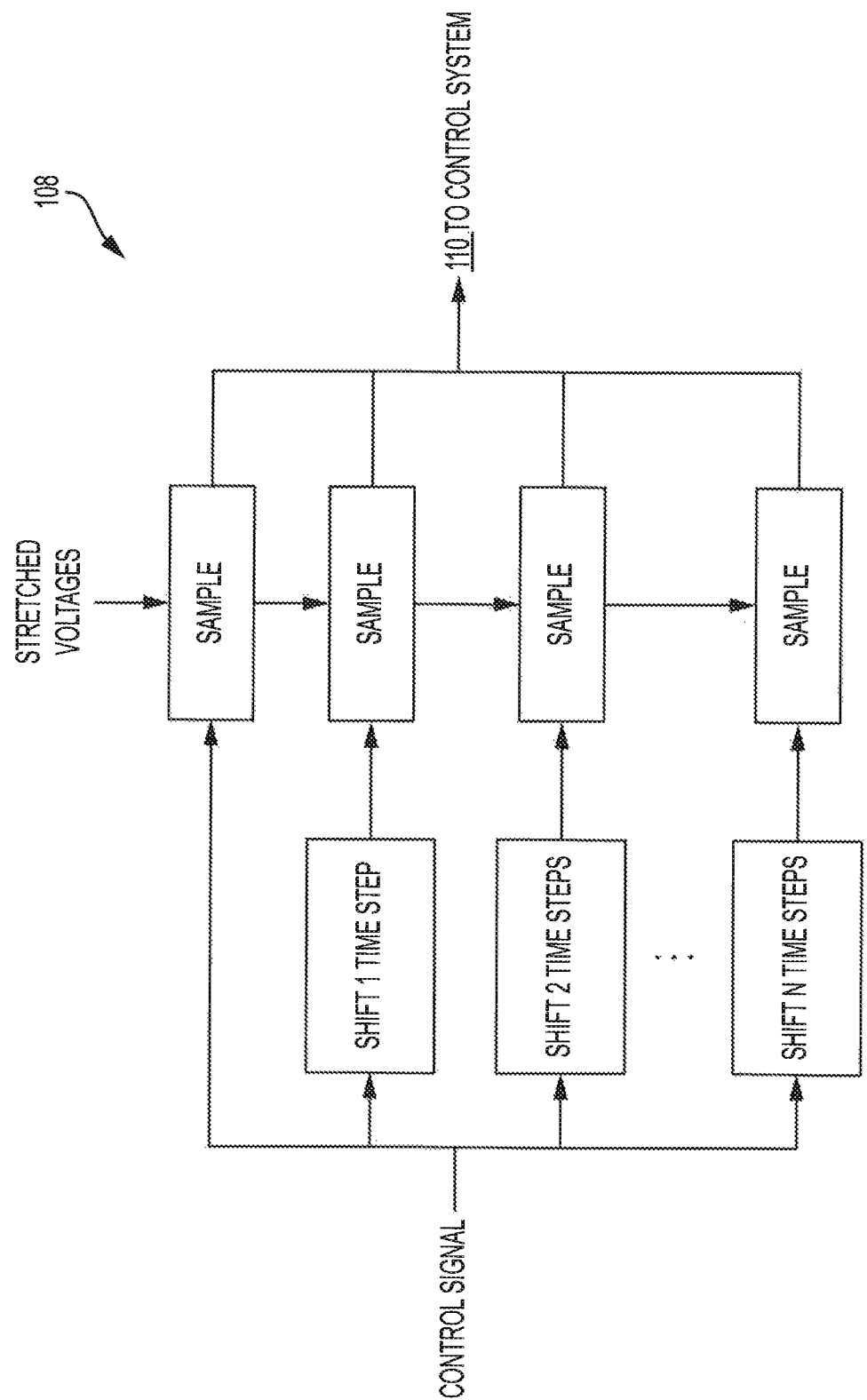
FIG. 1B is a diagram of an example implementation of the pulse sampler of FIG. 1A.

FIG. 1B is a diagram of an example implementation of the pulse sampler 108 of FIG. 1A. In the example shown, the pulse sampler 108 is configured to obtain sampled voltages for respective control signal timing shifts in parallel with one another, as compared with performing sequential time shifts and obtaining the sampled voltages in series (e.g., as described below with respect to FIG. 11). In the example implementation, a control signal is split into N channels and N different time shifts are applied. The different time-shifted control signals are then used to sample stretched voltage signals received from the pulse stretcher 106, and the different sampled voltages are provided to the control system 110 for analysis as described below.

FIG. 2A is a diagram of an example photodetector circuit 210 for converting an optical signal to a voltage signal. The example photodetector circuit 210 includes a photodiode 212 that receives the optical signals (e.g., from a laser) and converts the optical signals to voltage signals. The voltage signals from the photodiode 212 are then input to the opamp 214, which provides an amplified or buffered voltage output signal at terminal 216. In some embodiments, the output signal at terminal 216 is similar to waveform 402 of FIG. 4A.

FIG. 2B is a diagram of an example integrating circuit 220 for stretching a voltage signal. The example integrating circuit 220 includes an input terminal 226 that receives voltage signals for stretching. In some embodiments, the voltage signal input to the terminal 226 may be the same as the voltage signal at terminal 216 in FIG. 2A. The input voltage signal at 226 is passed to the cascaded opamps 222, 224, which are configured to integrate and stretch the input voltage signal and provide a stretched output voltage signal at terminal 228. In some embodiments, the input signal at terminal 226 is similar to waveform 402 of FIG. 4A and the output signal at terminal 228 is similar to the waveform 404 of FIG. 4B.

Figure 2C:
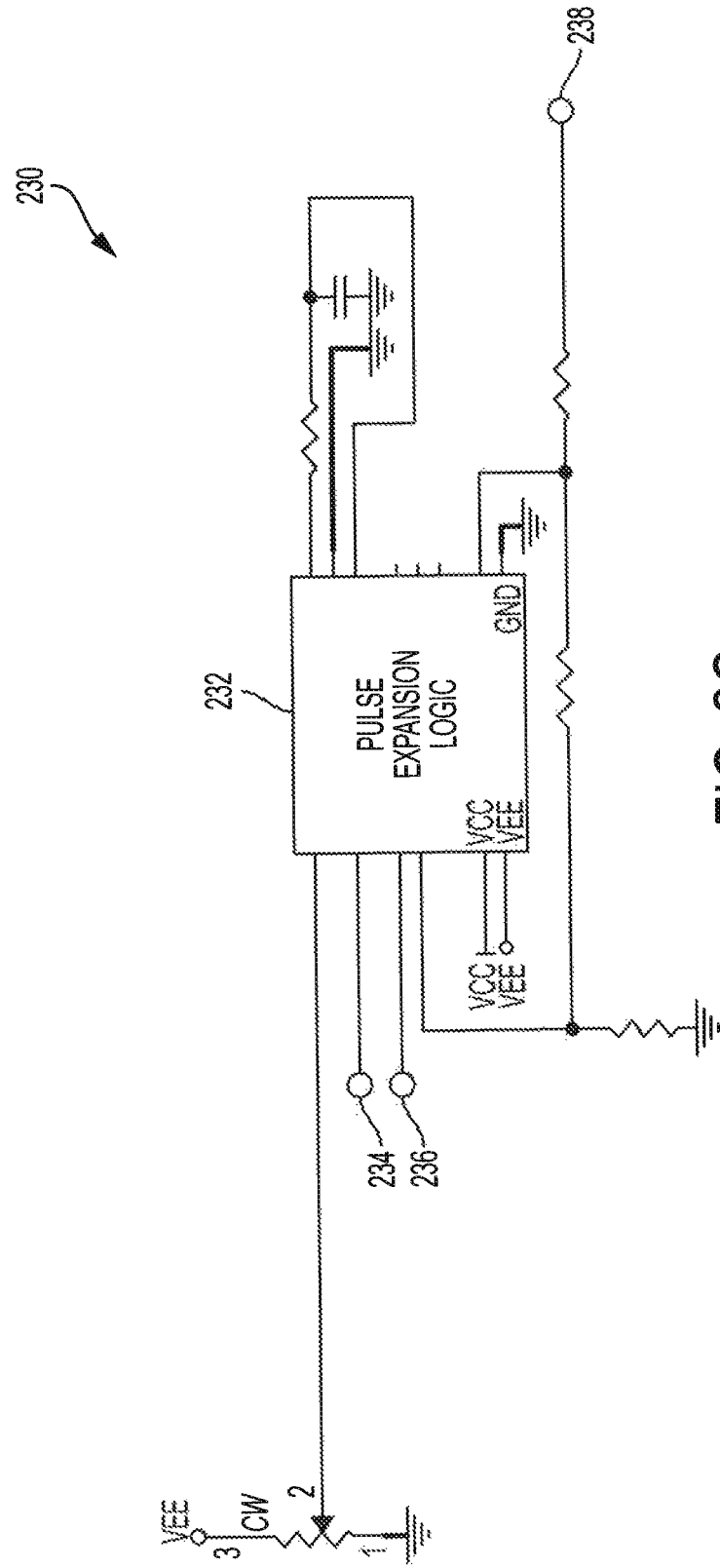
FIG. 2C is a diagram of an example pulse expansion circuit for sampling and holding a voltage signal.

FIG. 2C is a diagram of an example pulse expansion circuit 230 for sampling and holding a voltage signal. The example pulse expansion circuit 230 includes a pulse expansion logic 232 that receives a voltage signal at terminal 236, samples the voltage signal based on a control signal received at terminal 234, and provides an output signal at terminal 238. The pulse expansion logic 232 may include one or more opamps or other suitable logic circuit. For example, in some embodiments, the pulse expansion logic 232 includes an OPA615 opamp. As another example, in some embodiments, the pulse expansion logic 232 is configured similar to the circuit 240 of FIG. 2D. The voltage signal input at terminal 236 may be the same as the voltage signal at terminal 228 of FIG. 2B. In some embodiments, the voltage signal input at terminal 236 is similar to waveform 502 of FIG. 5, the control signal input at terminal 234 is similar to waveform 504 of FIG. 5, and the output signal at terminal 238 is similar to waveform 602 of FIG. 6.

Figure 2D:
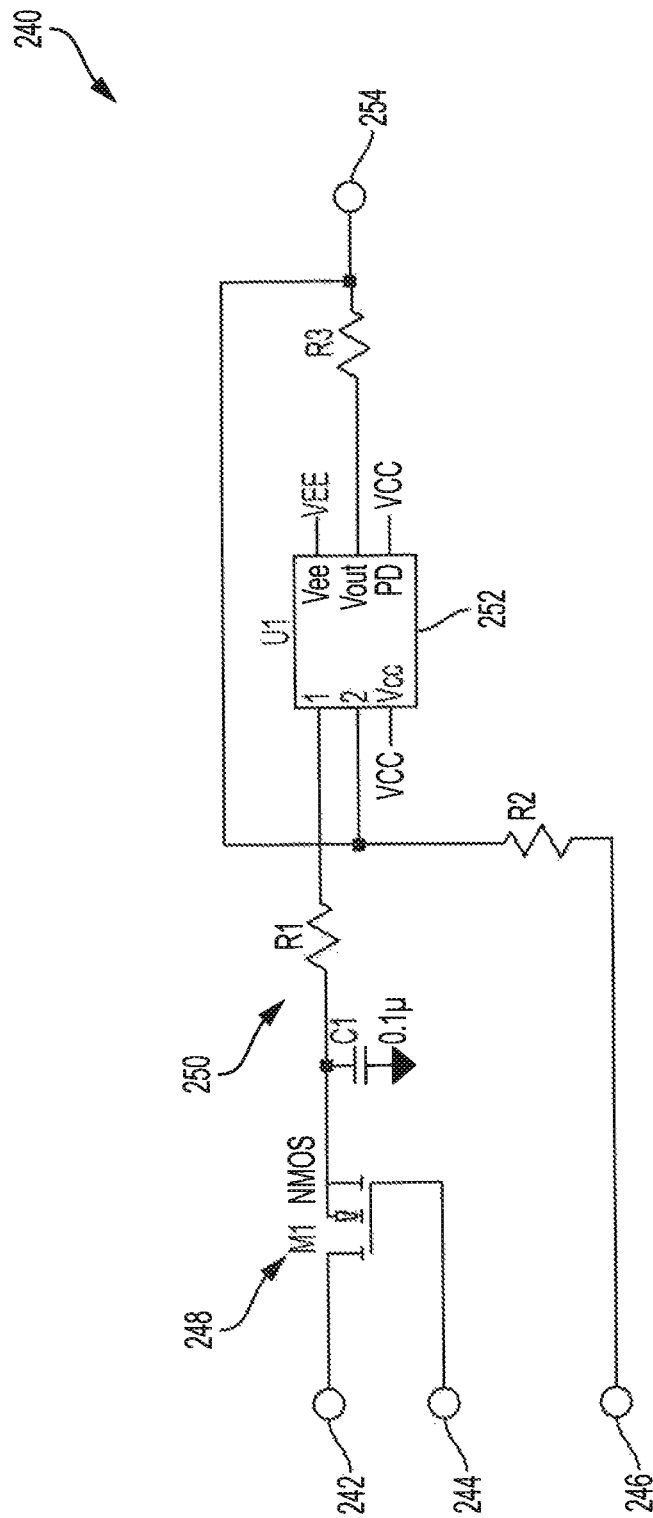
FIG. 2D is a diagram of an example pulse expansion logic circuit for the pulse expansion circuit of FIG. 2C.

FIG. 2D is a diagram of an example pulse expansion logic circuit 240 for the pulse expansion circuit of FIG. 2C. The pulse expansion logic circuit 240 includes input terminals 242, 244, 246, an n-channel MOSFET 248, RC circuit 250, a non-inverting high speed opamp 252, and a terminal 254. The terminals 242, 244 may receive the same signals as described above with respect to terminals 234, 246, respectively, and the terminal 254 may output the same signals as described above with respect to terminal 238. The terminal 246 may receive a bias voltage for the opamp 252.

Figure 3:
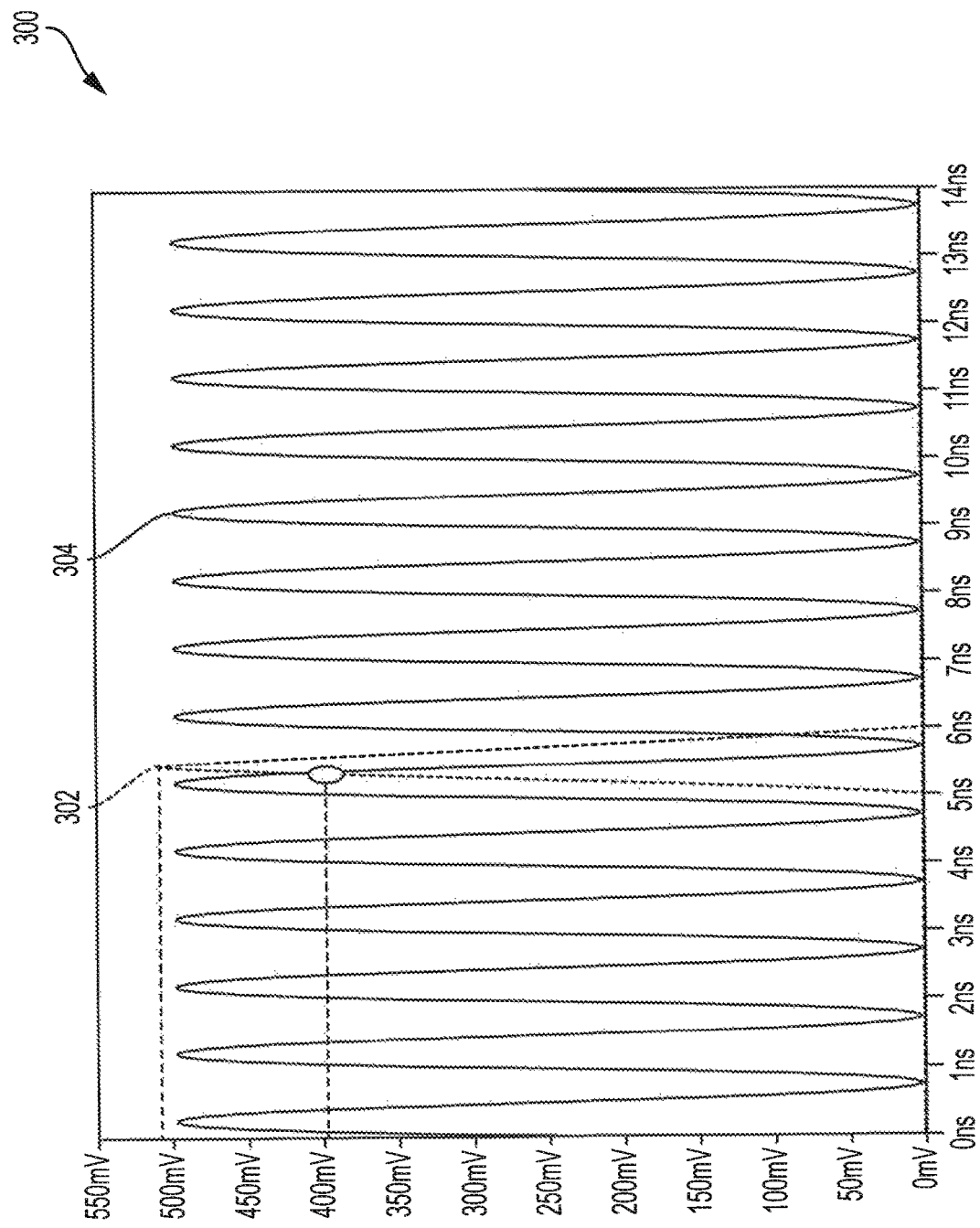
FIG. 3 is an example plot of waveforms for a voltage signal from a photodetector circuit and for a system clock signal.

FIG. 3 is an example plot of waveforms 302, 304 for a voltage signal from a photodetector circuit and for a system clock signal, respectively. In the example shown, the clock signal waveform 304 is used to sample the waveform 302 from a photodetector circuit (e.g., the photodetector circuit 210 of FIG. 2A). The sampled voltage may be used as a proxy for the peak pulse energy of a laser system. However, as shown, because the clock signal waveform 304 does not exactly coincide with the pulse signal waveform 302, sampling may be inconsistent and provide inaccurate peak pulse energy levels. For instance, in the example shown, the peak pulse voltage for the waveform 302 is approximately 500 mV, but in the example shown, the clock signal samples the waveform at the intersection of the respective waveforms, which may provide a peak pulse reading of approximately 400 mV.

Figures 4A, 4B:
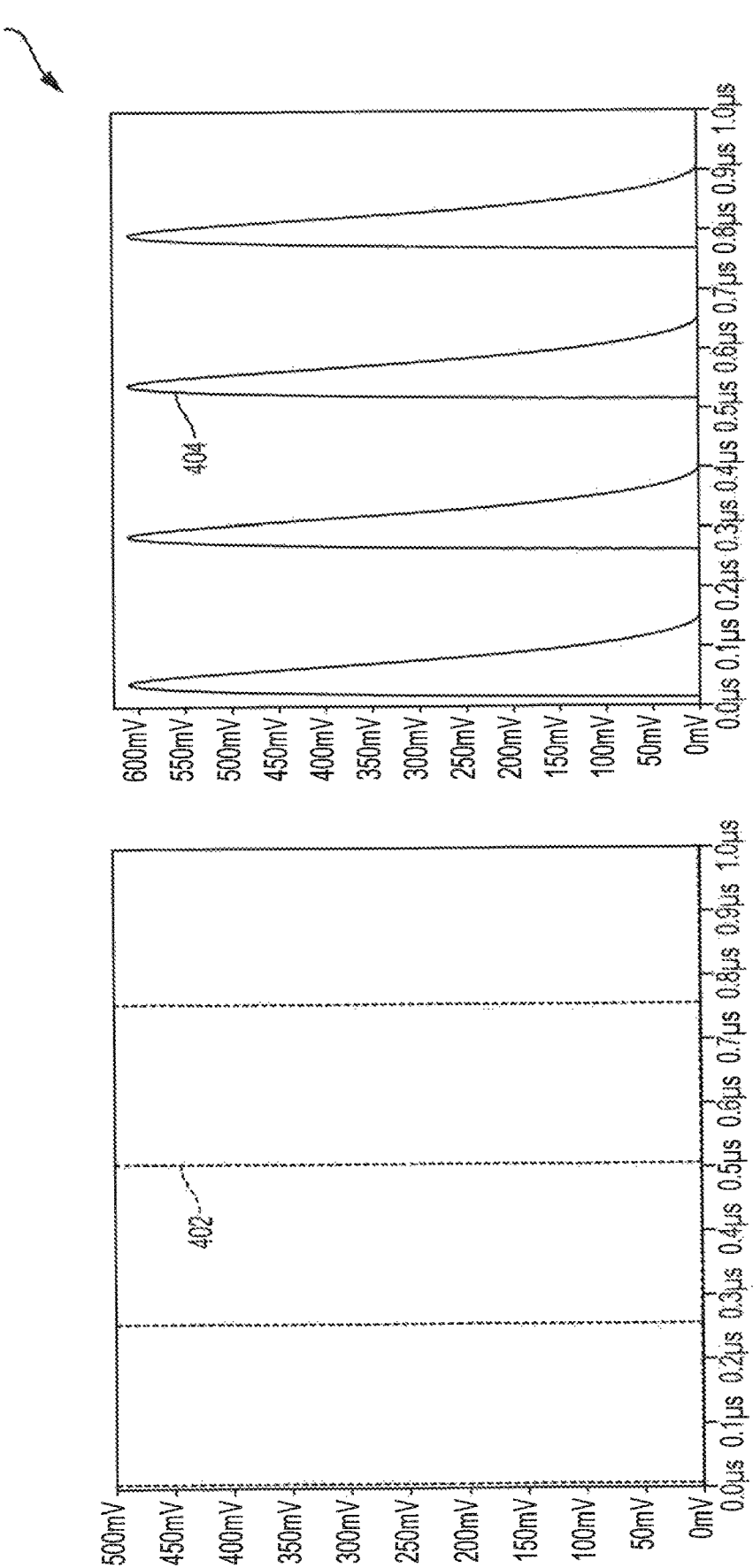
FIGS. 4A-4B are example plots of waveforms for a voltage signal from a photodetector circuit and for a stretched voltage signal.

FIGS. 4A-4B are example plots of waveforms 402, 404 for a voltage signal from a photodetector circuit and for a stretched voltage signal, respectively. The waveform 402 in FIG. 4A may represent an output voltage of a photodetector circuit (e.g., the photodetector circuit 210 of FIG. 2A), while the waveforms 404 of FIG. 4B may represent an output of an integrating circuit (e.g., the integrating circuit 220 of FIG. 2B). In the example shown, the pulses of waveform 402 may be approximately 2 ns, while the pulses of waveform 404 may be approximately 10-12 ns. The stretched voltage waveform 404 may be used for sampling in a peak pulse detection system, such as the peak pulse detection system 100 of FIG. 1A.

Figure 5:
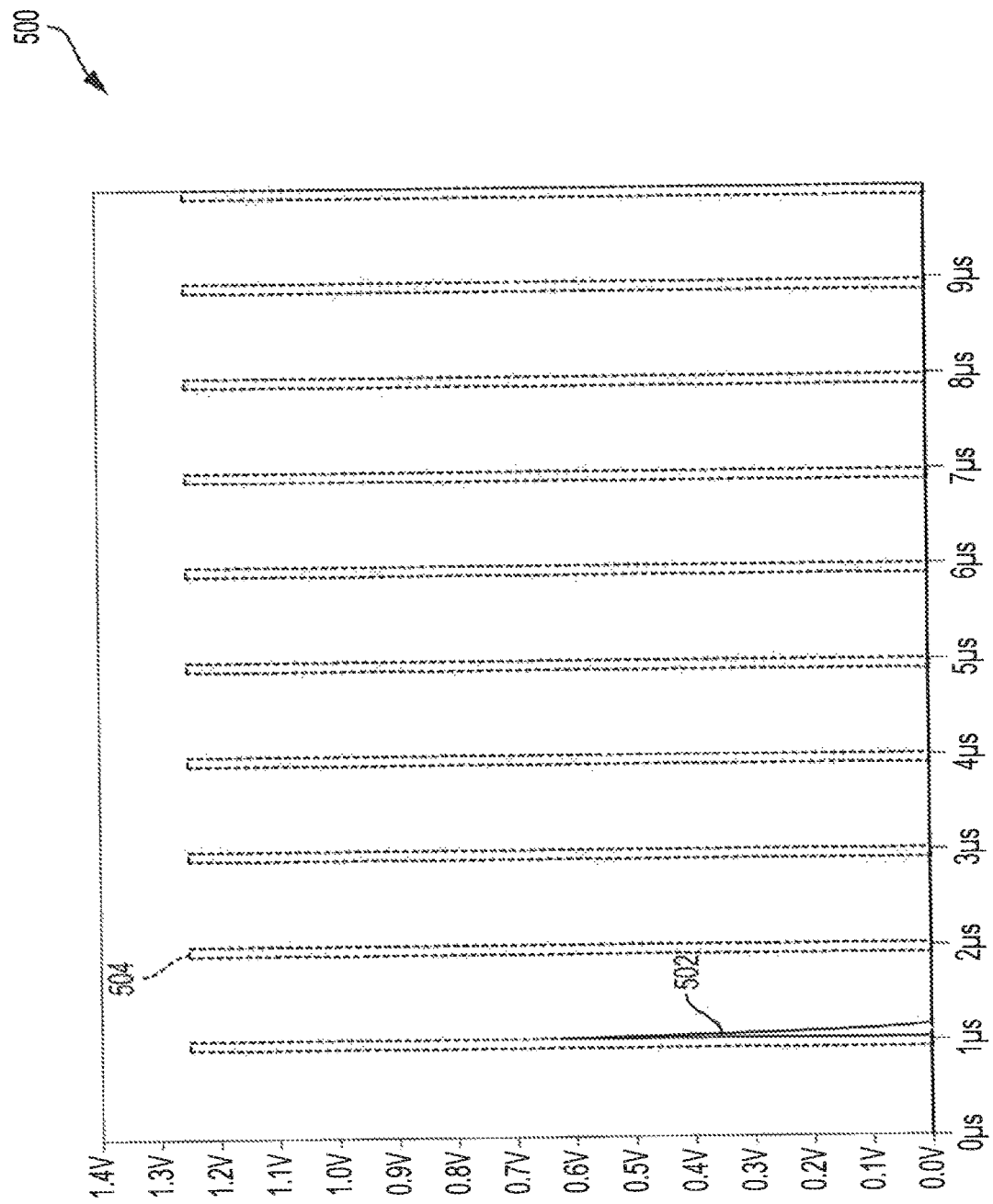
FIG. 5 is an example plot of waveforms for a stretched voltage signal and a control signal for sampling the stretched voltage signal.

FIG. 5 is an example plot of waveforms 502, 504 for a stretched voltage signal and a control signal for sampling the stretched voltage signal, respectively. In the example shown, the waveform 502 is output from a pulse stretcher (e.g., pulse stretcher 106 of FIG. 1A) that has stretched a voltage signal received from a photodetector circuit (e.g., photodetector circuit 104 of FIG. 1A). The waveform 504 represents a voltage signal used for sampling the stretched voltage signal waveform 502. The sampling performed by the waveform 504 may be based on an intersection of the waveforms 502, 504. In the example shown, the waveform 504 is a periodic square wave. The waveform 504 may be formatted in another manner. In some embodiments, the waveform 502 may be similar to the waveform 404 of FIG. 4B.

Figure 6:
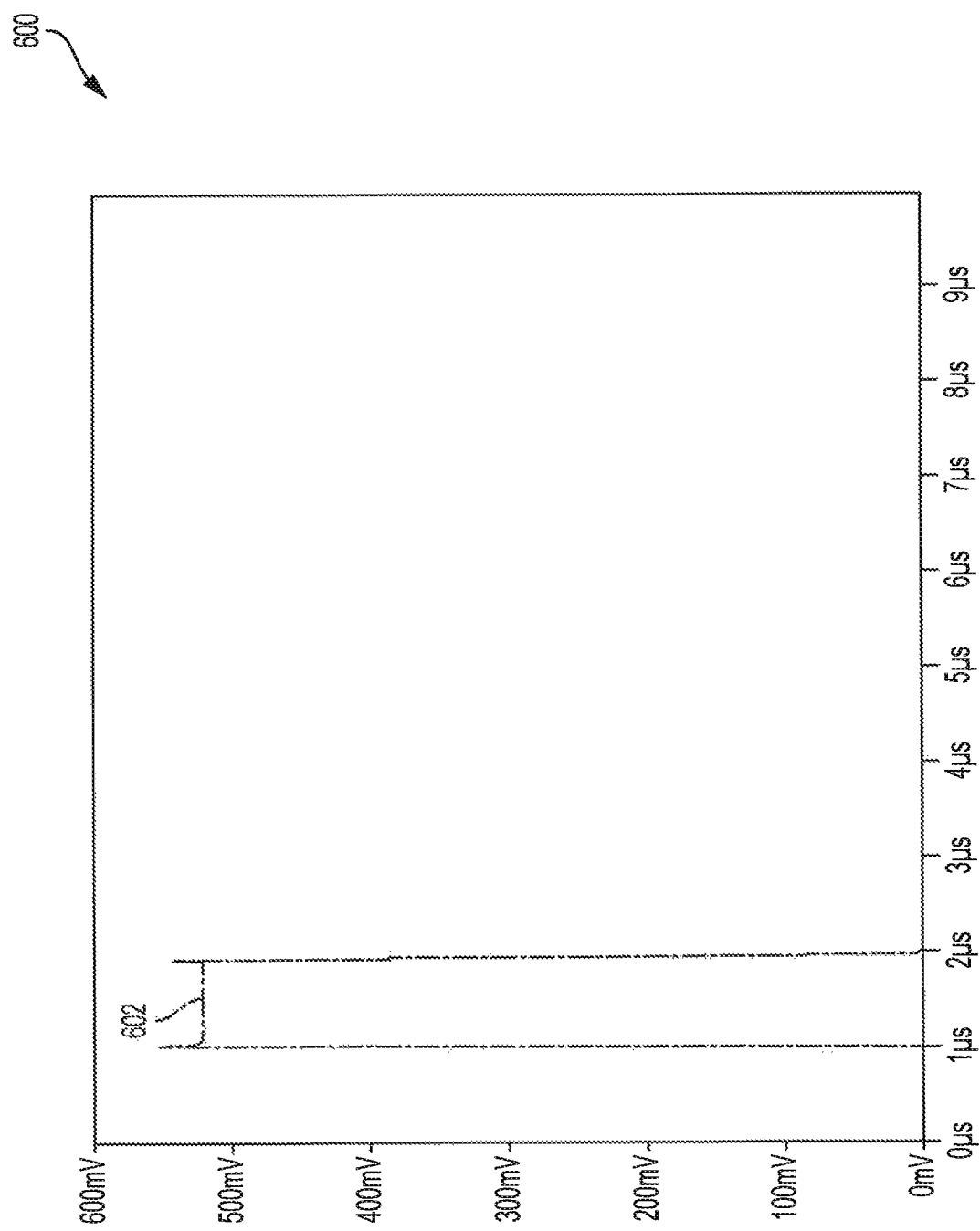
FIG. 6 is an example plot of a waveform associated with a sampled voltage signal using a control signal.

FIG. 6 is an example plot of a waveform 602 associated with a voltage signal sampled using a control signal. For example, the waveform 602 may be produced by sampling the waveform 502 using the control signal waveform 504. The waveform 602 may be output by a pulse sampler (e.g., the pulse sampler 108 of FIG. 1A) based on control signals (e.g., control signal waveform 504 of FIG. 5) received from a control system (e.g., control system 110 of FIG. 1A). The waveform 602 may indicate an estimated peak pulse energy level for a laser system (e.g., the laser system 102 of FIG. 1A).

FIGS. 7A-7E are diagrams showing example sampling of photodetector voltage signals using control signals of shifted timing. In the examples shown, the control signal waveforms 702 are used to sample the stretched voltage signal waveforms 704 to produce the waveforms 706. The waveform 702 may be similar to the waveform 504 of FIG. 5, the waveform 704 may be similar to the waveform 502 of FIG. 5, and the waveform 706 may be similar to the waveform 602 of FIG. 6. As shown in FIGS. 7A-7E, a timing of the control signals 702 may be shifted to sample the waveforms 704 at different points, producing different peak values in the waveforms 706. In the examples shown, the control signals 702 are shifted in time steps of 5 ns around a nominal control signal timing, with the shifts being +/−10 ns, +/−5 ns, and 0 ns (i.e., the nominal control signal timing). The sampled waveforms 706 may be obtained by a pulse sampler in series (i.e., obtain waveform 706A, then 706B, and so on) or in parallel (e.g., waveforms 706 are obtained simultaneously, such as using the implementation of a pulse sampler described above with respect to FIG. 1B).

Figure 7A:
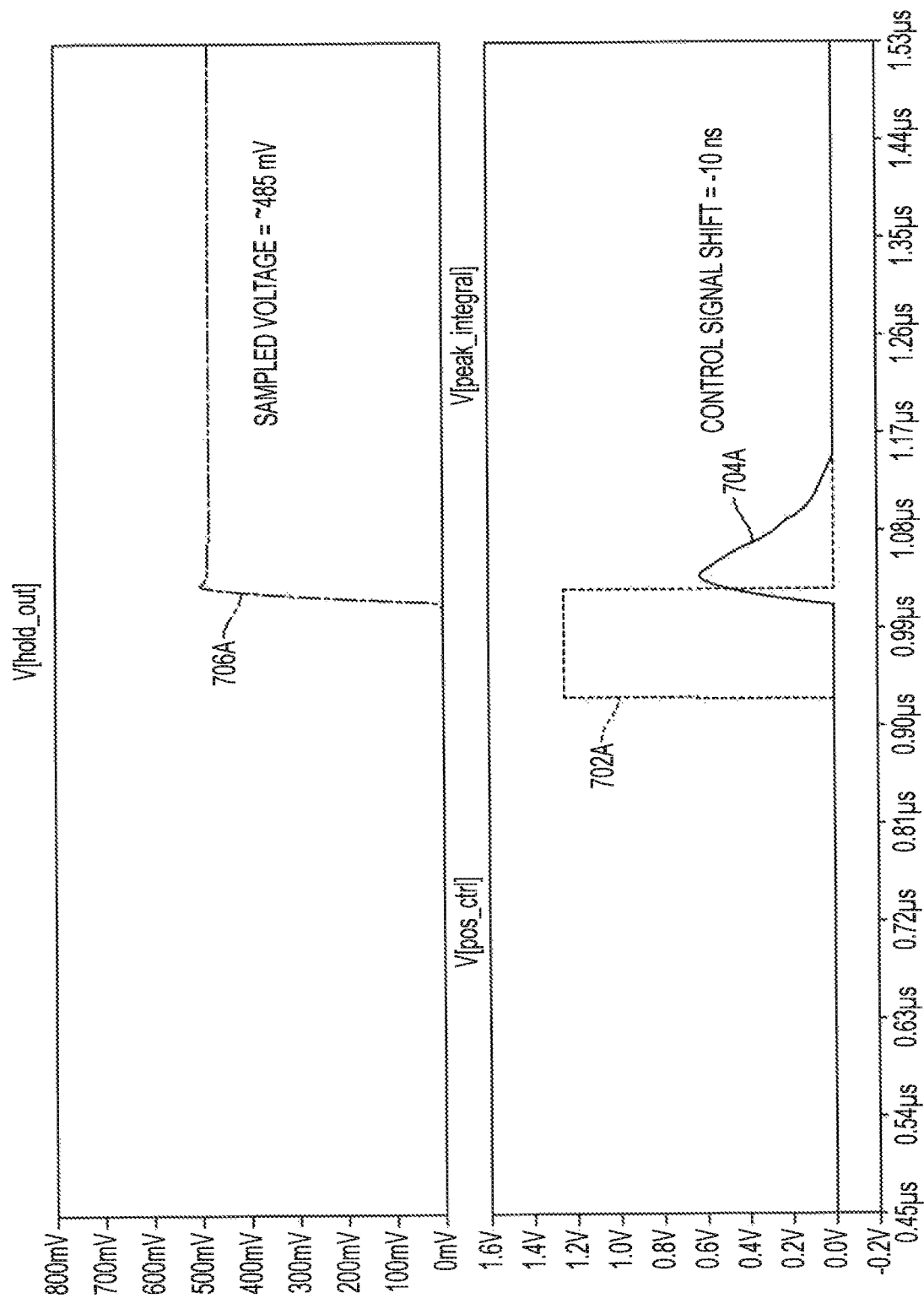
FIGS. 7A-7E are diagrams showing example sampling of photodetector voltage signals using control signals of shifted timing.
Figure 7B:
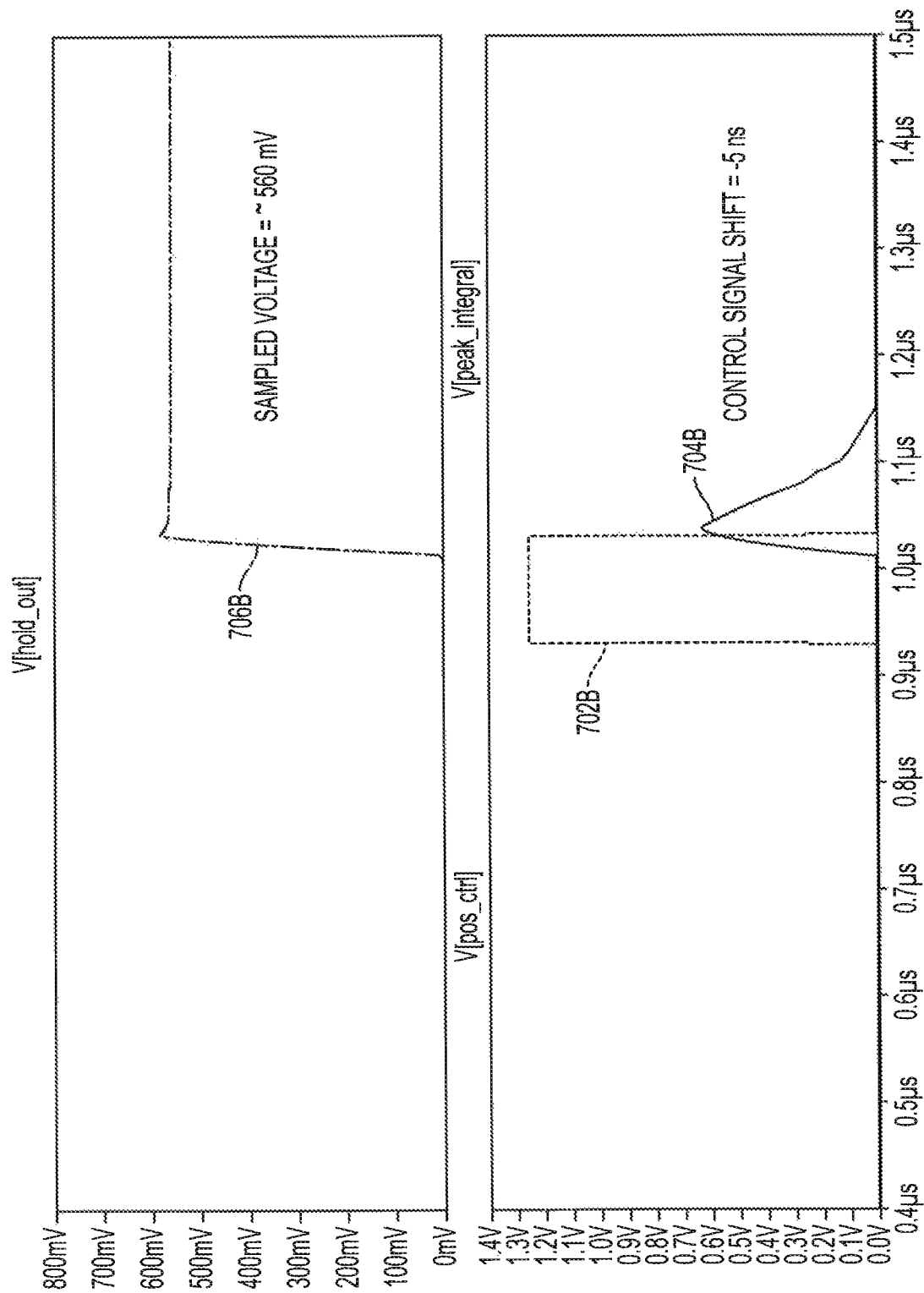
Figure 7C:
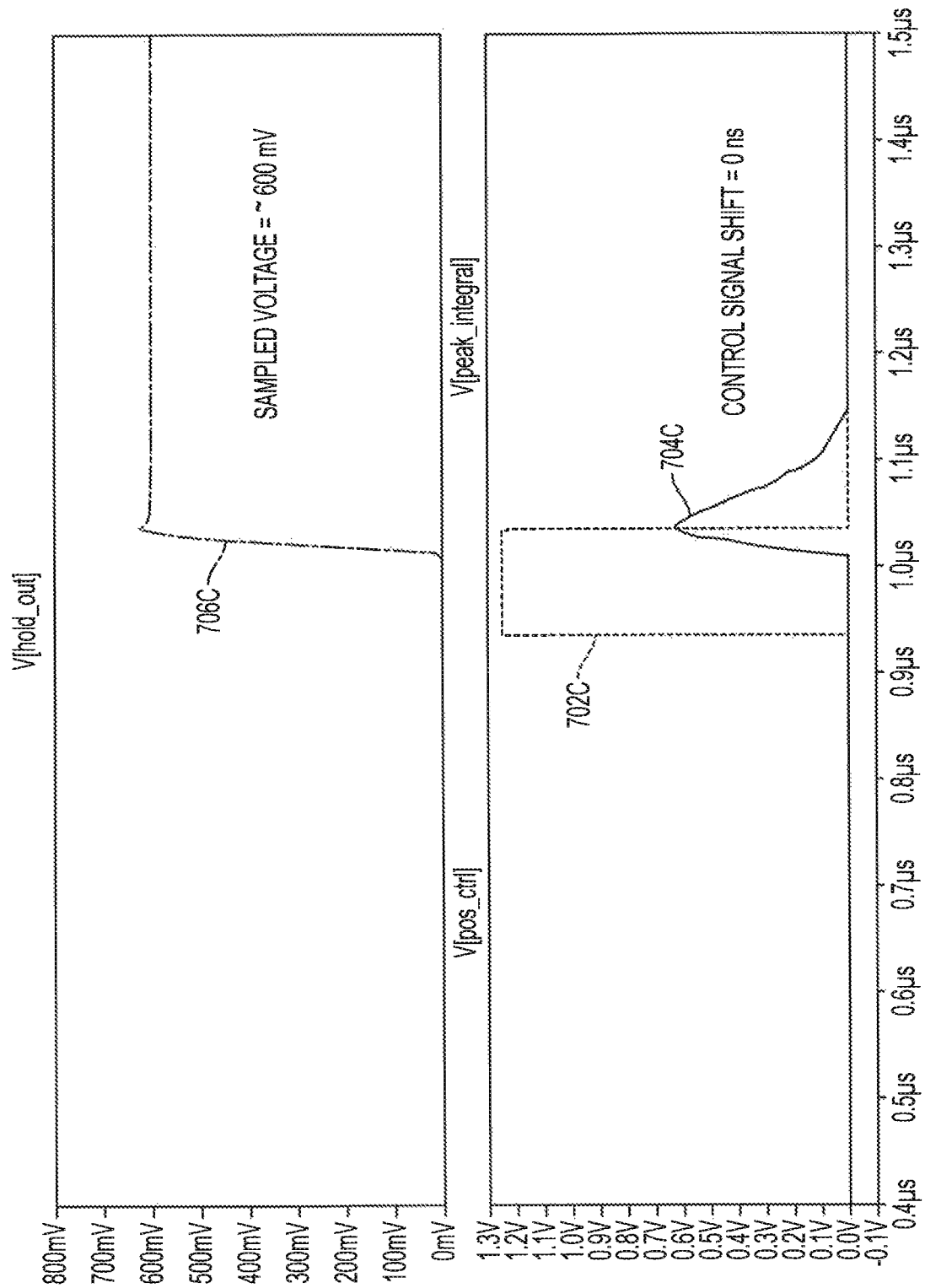
Figure 7D:
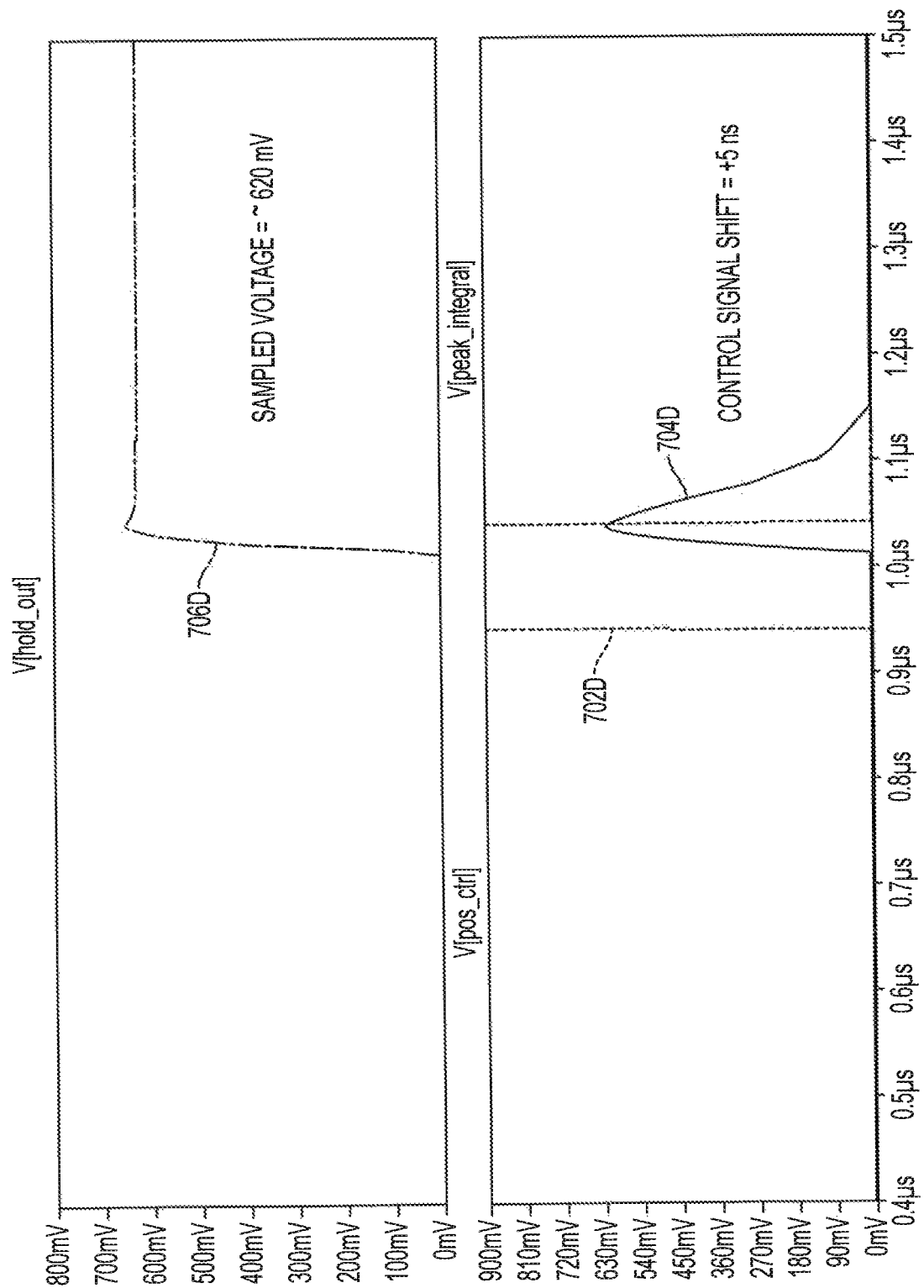
Figure 7E:
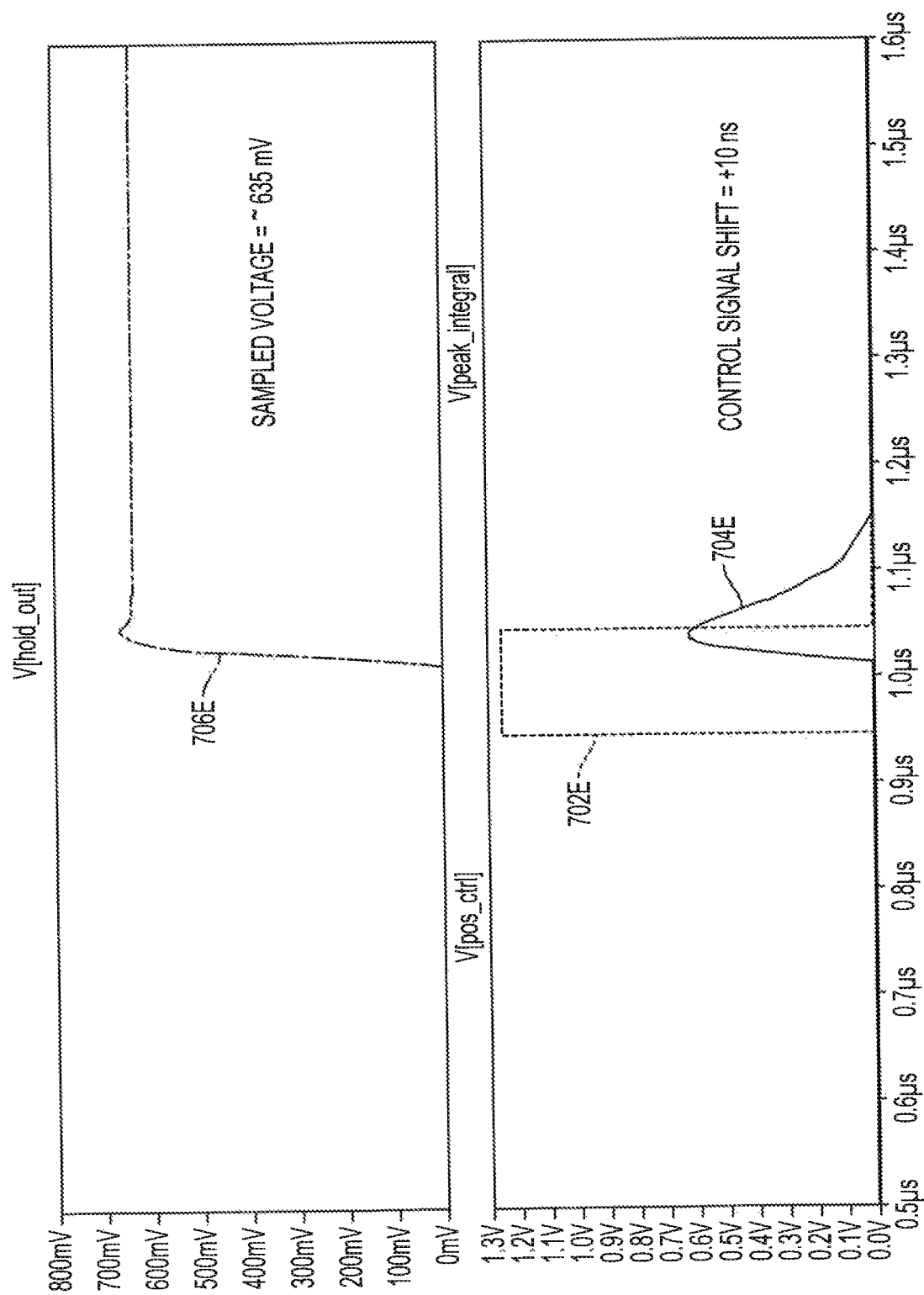

For instance, in FIG. 7A, the control signal timing has been shifted by −10 ns, with such a timing shift producing a sampled voltage of approximately 485 mV. In FIG. 7B, the control signal timing has been shifted by −5 ns, with such a timing shift producing a sampled voltage of approximately 560 mV. In FIG. 7C, the control signal timing has been shifted by 0 ns (and is thus, the nominal control signal timing), with such a timing shift producing a sampled voltage of approximately 600 mV. In FIG. 7D, the control signal timing has been shifted by +5 ns, with such a timing shift producing a sampled peak voltage of approximately 620 mV. In FIG. 7E, the control signal timing has been shifted by +10 ns, with such a timing shift producing a sampled voltage of approximately 635 mV. These sampled peak voltages may be analyzed by a control system to determine an optimal timing for the control signals used to sample the stretched voltage signals in a peak pulse detection system. For example, a control system configured similar to the control system 110 of FIG. 1A may determine that the +10 ns shift in the examples shown in FIGS. 7A-7E is the optimal control signal timing shift, since it produced the highest sampled voltage in waveforms 706.

Figure 8:
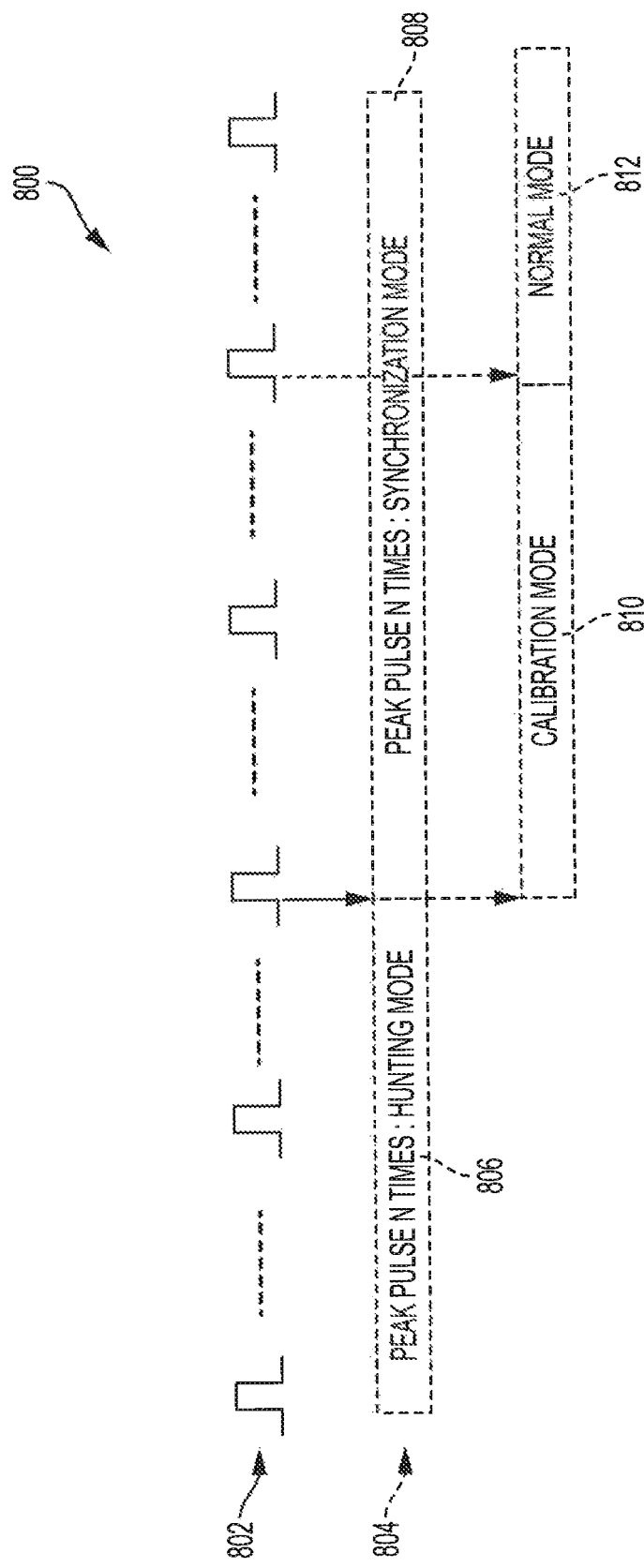
FIG. 8 is a diagram showing an example initialization process for a peak pulse detection system.

FIG. 8 is a diagram showing an example initialization process 800 for a peak pulse detection system. The peak pulse detection system may be configured similar to the peak pulse detection system 100 of FIG. 1A. In the example shown, the pulse train 802 represents pulses by a laser system for which peak pulse detection is performed, and the modes 804 represent different modes of operation of the peak pulse detection system at various times. The example hunting mode 806 represents a pre-staging period for the laser system (e.g., at power up of the laser system), during which the laser system is initializing. The hunting mode 806 may last for a number N of detected pulses of the laser system before transitioning in to synchronization mode 808, during which a control system synchronizes its control signal timing for sampling pulses generated by the laser system. The synchronization mode 808 may also last for a number N of detected pulses of the laser system. There are two example stages of the synchronization mode 808: calibration mode 810 and normal mode 812. During the calibration mode 810, the peak pulse detection system analyzes different shifts in control signal timing to determine an optimal control signal timing for sampling voltage signals based on pulses from the laser system. For instance, the control signal timing may be shifted as described above with respect to FIGS. 7A-7E during the calibration mode 810. During the normal mode 812, pulses from the laser system are measured and analyzed using the optimal control signal timing determined during the calibration mode 810.

Figure 9:
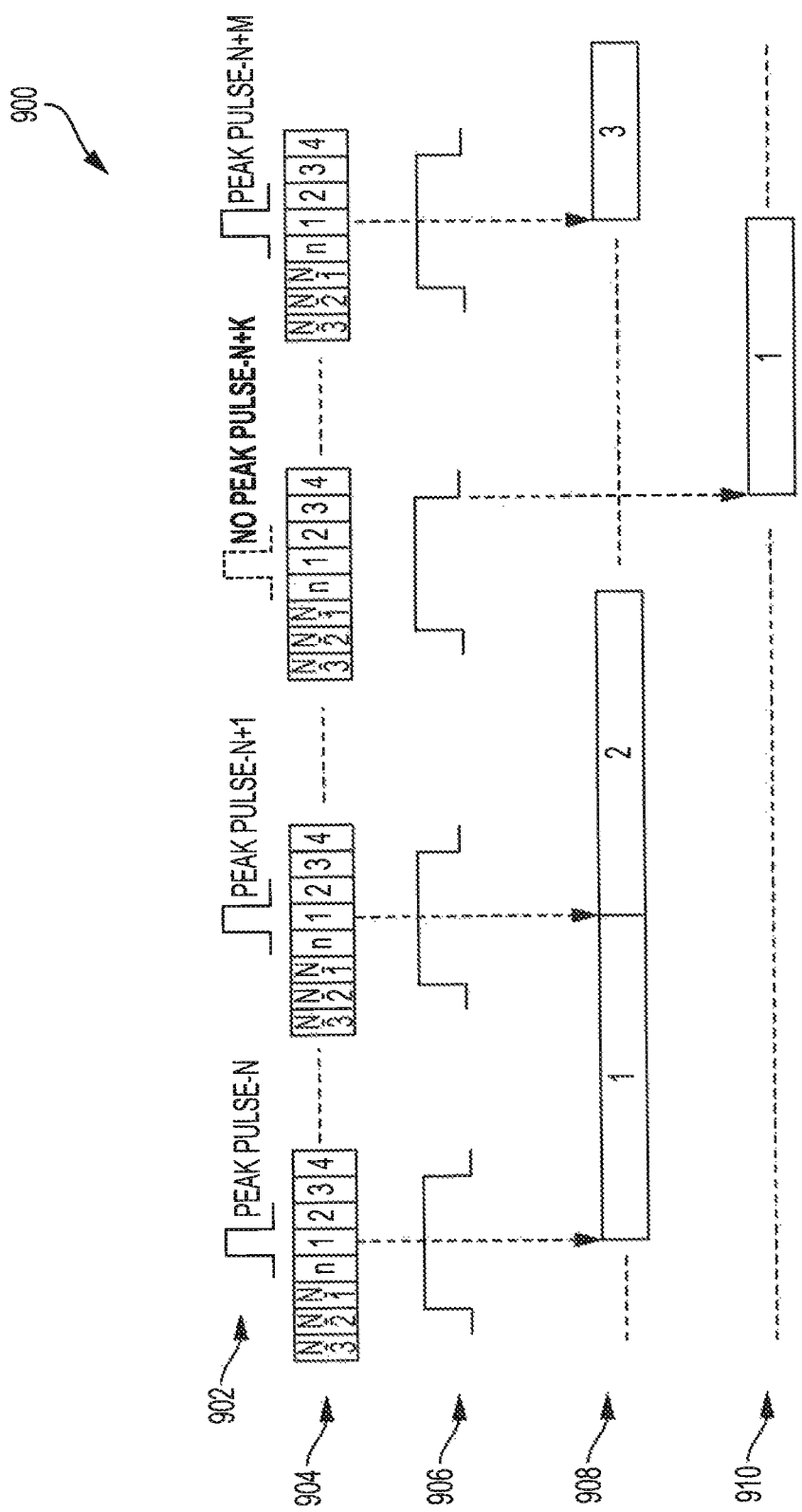
FIG. 9 is a diagram showing an example process for counting peak pulses detected by a peak pulse detection system.

FIG. 9 is a diagram showing an example process 900 for counting peak pulses detected by a peak pulse detection system. The peak pulse detection system may be configured similar to the peak pulse detection system 100 of FIG. 1A. In the example shown, the pulse train 902 represents voltage signals based on pulses of a laser system for which peak pulse detection is being performed, timings 904 represent timing shifts (in a number of n time steps, e.g., 5 ns) of the control signals used for sampling the pulse train 902, pulses 906 represent the control signals used for sampling the pulse train 902 at the indicated timing 904, counter 908 represents a counter for tracking a number of detected pulses at the indicated timing 904, and counter 910 represents a counter for tracking a number of non-detected pulses at the indicated timing 904. For instance, in FIG. 9, pulses N, N+1, and N+M are sampled at the timing step of n+1 (e.g., +5 ns) and the counter 908 is incremented accordingly. However, pulse N+K is not detected using by a control signal at timing of n+1, so the counter 910 is incremented instead of the counter 908. The count values may be used in a jitter analysis for various control signal timings, such as the process 1000 of FIG. 10.

Figure 10:
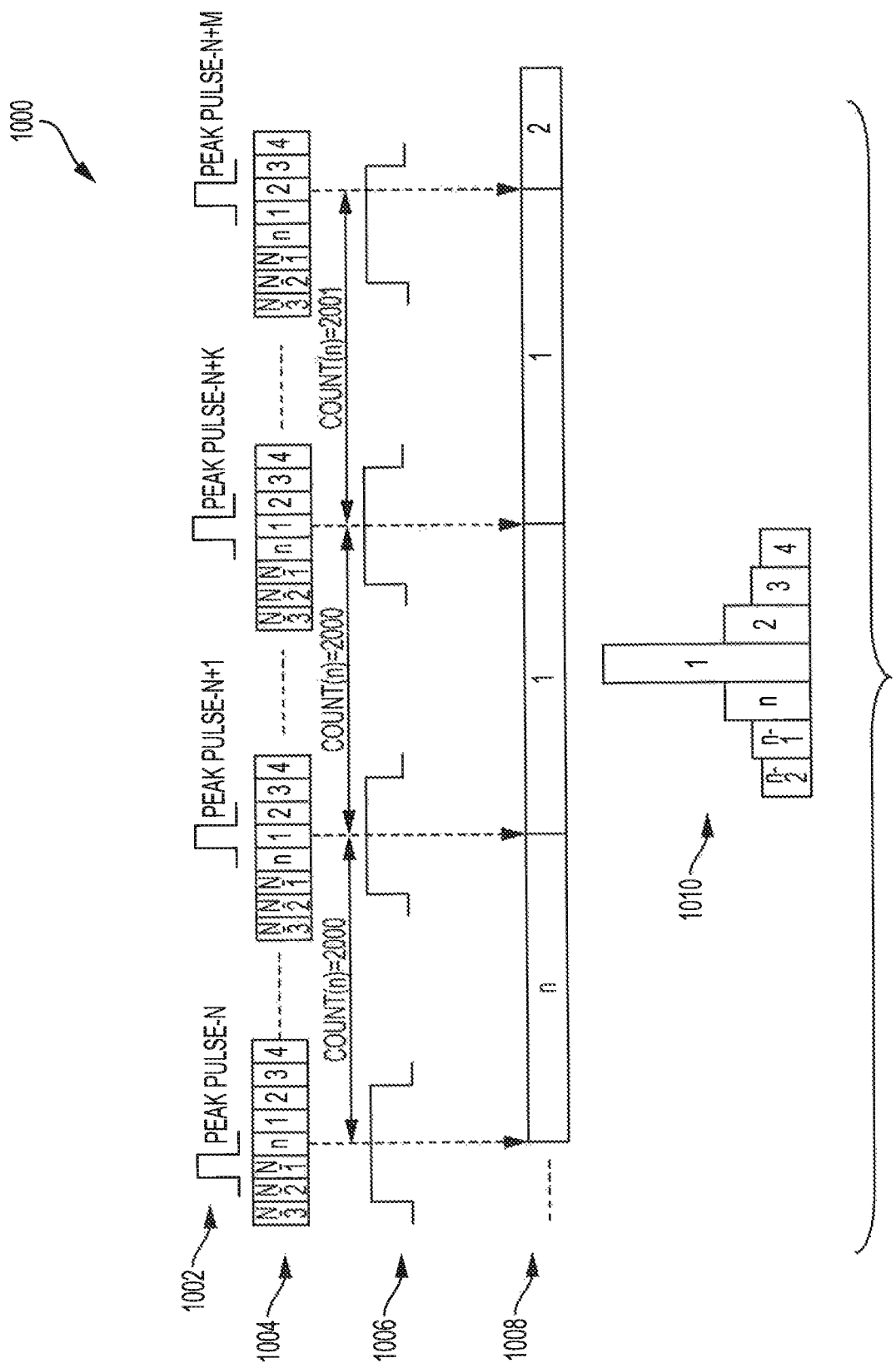
FIG. 10 is a diagram showing an example process for determining jitter associated with different control signal timings for a peak pulse detection system.

FIG. 10 is a diagram showing an example process 1000 for determining jitter associated with different control signal timings for a peak pulse detection system. The peak pulse detection system may be configured similar to the peak pulse detection system 100 of FIG. 1A. In the example shown, the pulse train 1002 represents voltage signals based on pulses of a laser system for which peak pulse detection is being performed, timings 1004 represent timing shifts (in a number of n time steps, e.g., 5 ns) of the control signals used for sampling the pulse train 1002, pulses 1006 represent the control signals used for sampling the pulse train 1002 at the indicated timing 1004, and counter 1008 represents a counter for tracking the indicated timing 1004 used to detect a peak pulse. For instance, pulse N of the pulse train 1002 is detected at timing n, pulses N+1 and N+K are detected at the timing n+1, and pulse N+M is detected at the timing n+2, as shown in counter 1008. At the end of the calibration period, the histogram 1010 may be generated. The histogram 1010 may represent a number of times a peak pulse was detected for a particular timing 1004. In the example shown, the timing of n+1 has detected the most pulses, and therefore may be selected as the optimal control signal timing shift. In some cases, for example, a laser system may have a pulse repetition rate of 50 kHz. If pulses are detected using control signals at 100 MHz, the control signal may cycle 2000 times between each peak pulse detection. However, in some cases, there may be slightly more or less control signal cycles between detections. For example, in some instances, the control signal may instead cycle 1999, 2001, or 2002 times before detecting a peak pulse. By counting the number of cycles between each peak pulse detection, and creating histogram data (like histogram 1010), an optimal control signal timing may be determined. This principle applies analogously for embodiments in which the laser system generates laser pulses at other rates, such as in the range of 50-500 kHz, and particularly between 50-250 kHz.

Figure 11:
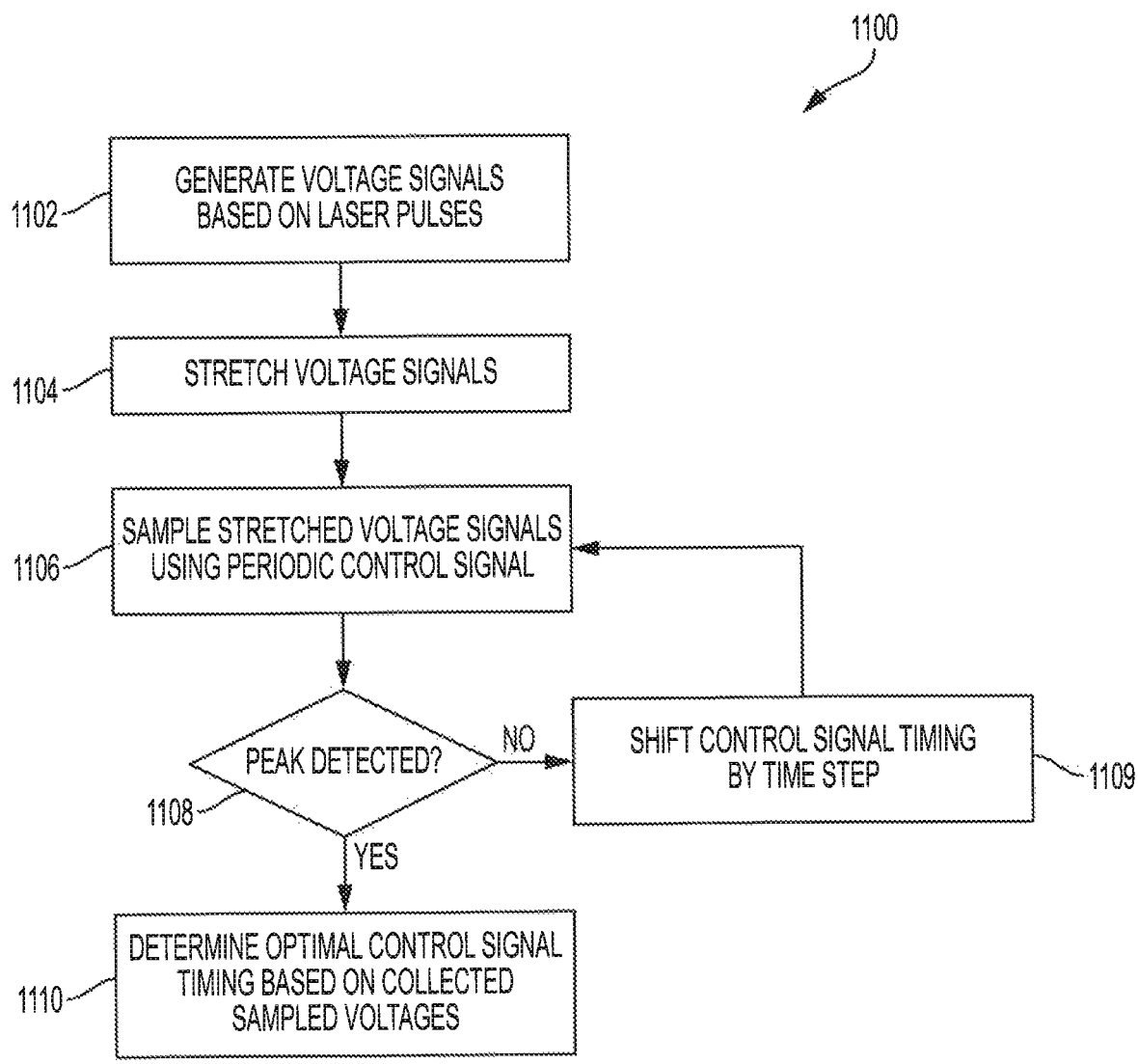
FIG. 11 is a flow diagram of an example process for determining control signal timing for detecting peak pulses of a laser system.

FIG. 11 is a flow diagram of an example process 1100 for determining control signal timing for detecting peak pulses of a laser system. Operations in the example process 1100 may be performed by components of a peak pulse detection system (e.g., the peak pulse detection peak pulse detection system 100 of FIG. 1A). The example process 1100 may include additional or different operations, and the operations may be performed in the order shown or in another order. In some cases, one or more of the operations shown in FIG. 11 are implemented as processes that include multiple operations, sub-processes, or other types of routines. In some cases, operations can be combined, performed in another order, performed in parallel, iterated, or otherwise repeated or performed another manner.

At 1102, voltage signals are generated based on laser pulses. In some embodiments, this may be done by converting the optical energy of the laser pulses into electrical energy. For example, the voltage signal may be generated using a photodetector circuit similar to the photodetector circuit 210 of FIG. 2A that includes a photodiode for converting the optical signals into electrical signals. The voltage signals generated at 1102 may be formatted similar to the waveform 402 of FIG. 4A.

At 1104, the voltage signals generated at 1102 are stretched. In some embodiments, the voltage signals may be stretched using an integrating circuit. For example, the voltage signals may be stretched using an integrating circuit similar to the integrating circuit 220 of FIG. 2B that includes cascaded opamps. The stretched voltage signals generated at 1104 may be formatted similar to the waveform 404 of FIG. 4B.

At 1106, the stretched voltage signals of 1104 are sampled using a periodic control signal. In some embodiments, the stretched voltage signals are sampled by a pulse sampler similar to the pulse sampler 108 of FIG. 1A based on control signals generated by a control system similar to the control system 110 of FIG. 1A. The control signals may have a repetition rate similar to the repetition rate of the laser system under analysis. The periodic control signal may be a periodic square wave signal in some cases. For example, the periodic control signal is formatted similar to the waveform 504 of FIG. 5. In some embodiments, sampling the control signals includes holding a sampled voltage for a predetermined time duration. For example, the voltage may be held as shown in waveform 602 of FIG. 6, so that it may be effectively read by the control system 110.

At 1108, it is determined whether a peak is detected in a set of sampled voltages generated at 1106. In some embodiments, this may be done by detecting whether a trend in the sampled voltages has changed. Referring to the examples shown in FIGS. 7A-7E, the trend in the sampled voltages is increasing. If a peak has been detected at a particular control signal timing (e.g., +10 ns in FIG. 7E), for example, the next sampled voltage may start a downward trend in the sampled voltage values. Based on this change in the trend of sampled voltages, it may be determined whether a peak has been detected already.

If a peak is detected at 1108, then the control signal timing is shifted by a time step at 1109 and the stretched voltage signals are sampled using the shifted control signal at 1006. If, however, a peak is detected at 1008, then an optimal control signal timing is determined based on the set of sampled voltages collected by the sampling performed at 1006. In some embodiments, this may involve comparing each of the sampled voltages for the respective control signal timing shifts, and selecting a control signal timing shift based on the comparison. The sampled voltages may be compared up to a last time step shift. In some cases, the control signal timing shift associated with a highest sampled voltage may be selected as the optimal control signal timing.

Certain operations of process 1100 may be modified in some instances. For example, the stretched voltage signals may be sampled with different control signal timings in parallel at 1106. For instance, the stretched voltage signal may be split a number of times, with each split of the stretched voltage signal being sampled using a control signal having a different time shift. As an example, the stretched voltage may be split and sampled as shown in FIG. 1B and described above.

Further, in some instances, additional operations may be performed during the process 1100. For example, a number of pulses for respective control signal timing shifts may be counted (e.g., as shown in the jitter analysis of FIG. 10), and the optimal control signal timing shift may be selected based on counts for the respective control signal timing shifts.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer-readable storage medium for execution by, or to control the operation of, data-processing apparatus. A computer-readable storage medium can be, or can be included in, a computer-readable storage device, a computer-readable storage substrate, a random or serial access memory array or device, or a combination of one or more of them. Moreover, while a computer-readable storage medium is not a propagated signal, a computer-readable storage medium can be a source or destination of computer program instructions encoded in an artificially generated propagated signal. The computer-readable storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources. The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). The computer system may include one or more data processing apparatuses coupled to computer-readable media storing one or more computer programs that may be executed by the one or more data processing apparatuses, and one or more interfaces for communicating with other computer systems.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Embodiments of the present disclosure provide systems and methods for determining an optimal control signal timing for sampling laser pulses that may overcome limitations of conventional systems and methods. It will be appreciated that above-disclosed and other features and functions, or alternatives thereof, may be desirably combined into many other different systems or applications in accordance with the disclosure. It will also be appreciated that various presently unforeseen or unanticipated alternatives, modifications, variations, or improvements therein may be subsequently made by those skilled in the art which alternatives, variations and improvements are also intended to be encompassed by the following claims.

What is claimed is:

1. A system for detecting a peak laser pulse, comprising:
   a laser;
   a photodiode configured to detect pulses emitted by the laser; and
   circuitry configured to:
   receive a periodic series of voltage signals based on laser pulses detected by the photodiode;
   stretch the voltage signals;
   obtain sampled voltages from the stretched voltage signals using periodic control signals;
   shift the timing of the periodic control signals;
   count a number of pulses for each respective control signal timing shift;
   compare the sampled voltages for respective timings of the control signals; and
   select an optimal control signal timing based on the comparison and based on counts for respective control signal timing shifts.

2. The system of claim 1, wherein:
   the circuitry configured to stretch the periodic voltage signals comprises an integrating circuit; and
   the circuitry configured to shift the periodic control signals is configured to shift the control signals by a number of time steps.

3. The system of claim 1, wherein the circuitry configured to obtain sampled voltages from the stretched voltage signals is configured to hold the sampled voltages for a time duration.

4. The system of claim 1, wherein the circuitry configured to select an optimal control signal timing shift is configured to select the control signal timing shift associated with a highest sampled voltage.

5. The system of claim 1, wherein the circuitry is configured to configured to shift the timing of the control signal by a number of time steps, and obtain the sampled voltages in parallel up to a last time step.

6. The system of claim 1, wherein the laser pulses have a pulse width in the range of 300 femtoseconds to 1.2 picoseconds.

7. An apparatus comprising circuitry configured to:
   receive a periodic series of voltage signals based on laser pulses detected by a photodiode;
   stretch the voltage signals;
   obtain sampled voltages from the stretched voltage signals using periodic control signals;
   shift the timing of the periodic control signals;
   compare the sampled voltages for respective timings of the control signals;
   count a number of pulses for each respective control signal timing shift; and
   select an optimal control signal timing based on the comparison and based on counts for respective control signal timing shifts.

8. The apparatus of claim 7, wherein:
   the circuitry is configured to stretch the periodic voltage signals using an integrating circuit; and
   the circuitry configured to shift the periodic control signals is configured to shift the control signals by a time step.

9. The apparatus of claim 7, wherein the circuitry configured to obtain sampled voltages from the stretched voltage signals is configured to hold the sampled voltages for a time duration.

10. The apparatus of claim 7, wherein the circuitry configured to select an optimal control signal timing shift is configured to select the control signal timing shift associated with a highest sampled voltage.

11. The apparatus of claim 7, wherein the circuitry is configured to shift the timing of the control signal by a number of time steps, and obtain the sampled voltages in parallel up to a last time step.

12. The apparatus of claim 7, wherein the laser pulses have a pulse width in the range of 300 femtoseconds to 1.2 picoseconds.

13. A method for detecting a peak pulse emitted by a laser, comprising:
   receiving a periodic series of voltage signals based on laser pulses detected by a photodiode, the laser pulses having a pulse width in the range of 300 femtoseconds to 1.2 picoseconds;
   stretching the voltage signals;
   counting a number of pulses for each respective timing shift;
   obtaining a set of sampled voltages from the stretched voltage signals using a set of shifted control signals, each shifted control signal having a respective timing shift from the other control signals;
   determining an optimal control signal timing based on a comparison of the sampled voltages for each of the timing shifts; and
   selecting a timing shift for the control signals based on counts for the respective timing shift.

14. The method of claim 13, wherein stretching the voltage signals comprises providing the series of voltage signals to an integrating circuit.

15. The method of claim 13, wherein obtaining the sampled voltages comprises holding the sampled voltages for a time duration.

16. The method of claim 13, wherein determining an optimal control signal timing comprises selecting the timing shift for the control signals associated with highest sampled voltages.

17. The method of claim 13, wherein the set of sampled voltages are obtained in parallel.

* * * * *